(12) United States Patent
Pham et al.

(10) Patent No.: US 12,069,805 B2
(45) Date of Patent: Aug. 20, 2024

(54) WIDEBAND MILLIMETER WAVE VIA TRANSITION

(71) Applicant: Apple Inc., Cupertino, CA (US)

(72) Inventors: Chi V. Pham, San Jose, CA (US); Xiaofang Mu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 63 days.

(21) Appl. No.: 17/482,943

(22) Filed: Sep. 23, 2021

(65) Prior Publication Data

US 2023/0078323 A1     Mar. 16, 2023

Related U.S. Application Data

(60) Provisional application No. 63/243,698, filed on Sep. 13, 2021.

(51) Int. Cl.
*H05K 1/00*     (2006.01)
*H01P 3/08*     (2006.01)
*H05K 1/02*     (2006.01)
*H05K 1/11*     (2006.01)

(52) U.S. Cl.
CPC .............. *H05K 1/116* (2013.01); *H01P 3/08* (2013.01); *H05K 1/0243* (2013.01); *H05K 2201/095* (2013.01)

(58) Field of Classification Search
CPC .............. H05K 1/116; H05K 1/0243; H05K 2201/095; H01P 3/08
See application file for complete search history.

(56) References Cited

U.S. PATENT DOCUMENTS

| | | | |
|---|---|---|---|
| 6,794,961 B2 * | 9/2004 | Nagaishi | H01Q 1/3233 257/E23.114 |
| 6,856,210 B2 | 2/2005 | Zhu et al. | |
| 7,868,257 B2 | 1/2011 | Kushta et al. | |
| 11,564,316 B2 * | 1/2023 | Zamarron | H05K 1/0237 |
| 2020/0211986 A1 * | 7/2020 | Curtis | H01L 23/49838 |

FOREIGN PATENT DOCUMENTS

CN      108598690      9/2018

* cited by examiner

*Primary Examiner* — Pete T Lee
(74) *Attorney, Agent, or Firm* — Kowert, Hood, Munyon, Rankin & Goetzel, P.C.; Gareth M. Sampson; Dean M. Munyon

(57) ABSTRACT

Devices are disclosed that include a wideband millimeter wave (mmW) via transition design for multilayer printed circuit boards (MLBs). In various instances embodiments, a via is dimensioned to provide impedance matching to stripline tracing connected at the end of the via. Impedance matching in the via may eliminate the need for an impedance matching section on the stripline tracing. In some instances, the dimensions of the via pad diameter and the via keepout diameter are selected to tune a via transition structure to selected frequencies and/or frequency bandwidths.

20 Claims, 8 Drawing Sheets

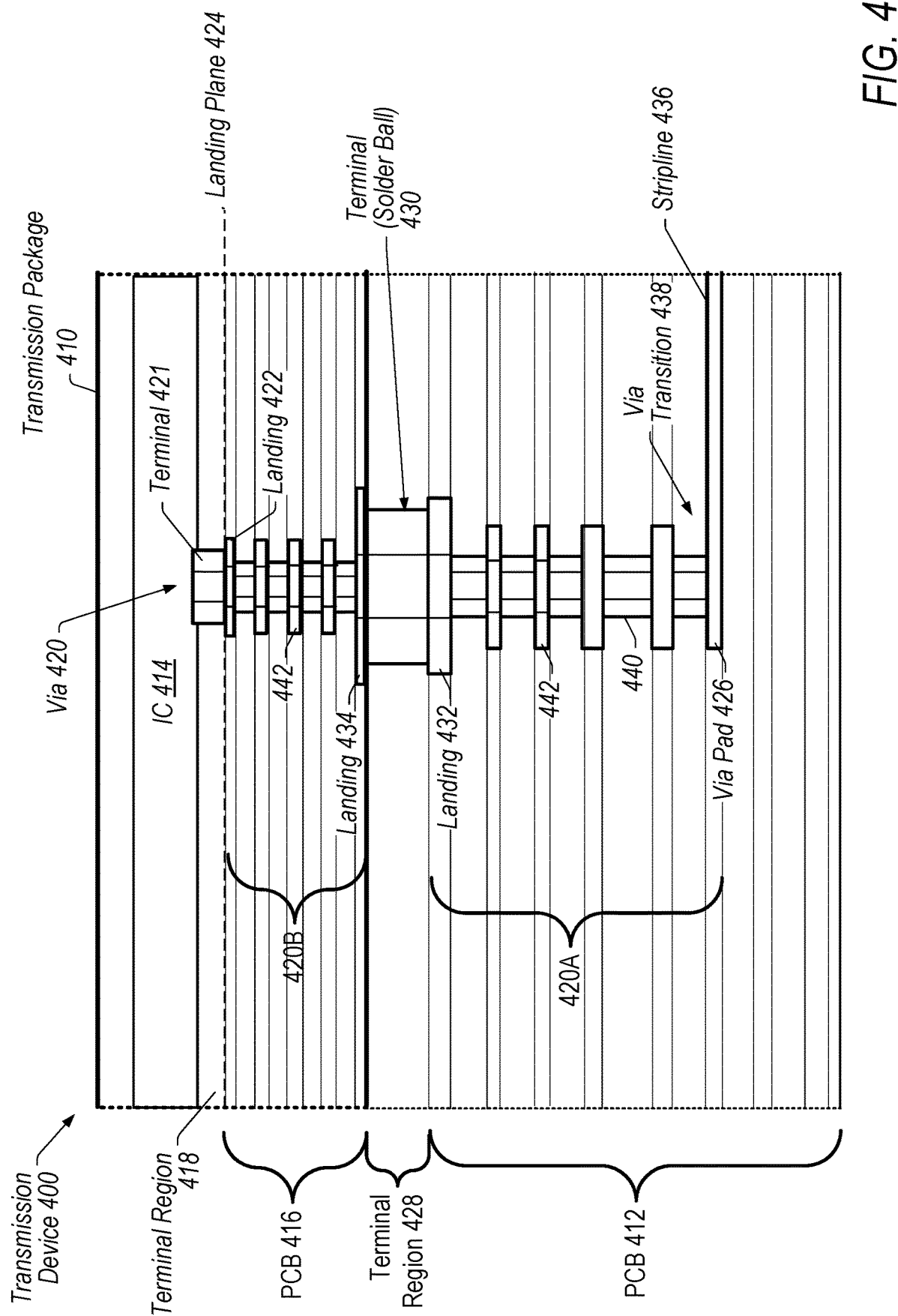

WIDEBAND MILLIMETER WAVE VIA TRANSITION

PRIORITY CLAIM

The present application claims the benefit of U.S. Provisional Appl. No. 63/243,698, filed Sep. 13, 2021, which is incorporated by reference herein in its entirety.

BACKGROUND

Technical Field

Embodiments described herein relate to printed circuit boards. More particularly, embodiments described herein relate to wideband millimeter wave via transmission in multilayer printed circuit boards.

Description of the Related Art

Various communication technologies implement signal transmission through printed circuit boards (e.g., multilayer printed circuit boards of main logic boards or MLBs). Connections between signal layers is typically provided through via transmission structures. For broadband structures (such as wideband millimeter wave structures), via transmission structures can have low return loss (e.g., high return reflection) and leakage that degrades transmission of signals through the structures. Further, signal transmission may be sensitive to manufacturing variations of the via transmission structures and be limited in bandwidth. Accordingly, improvements in via transmission structures and manufacturing of via transmission structures may improve signal transmission properties and device performance.

SUMMARY

Various embodiments are disclosed for a wideband millimeter wave (mmW) via transition design for multilayer printed circuit boards (MLBs). In one embodiment, a via is coupled to a via contact on a top layer of an MLB (e.g., the solder ball connection). Alternatively, the via may be coupled to a via contact pad positioned elsewhere. In certain embodiments, the via is dimensioned to provide impedance matching to the stripline tracing at the bottom of the via. Impedance matching in the via may eliminate the need for an impedance matching section on the stripline tracing, thus simplifying manufacturing and implementation. In various embodiments, the dimensions of the via pad diameter and the via keepout diameter are selected to tune a via transition structure for selected frequencies and frequency bandwidths. Accordingly, the via transition structures described herein may be tunable to target frequencies and target ranges while having better return loss properties.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 4 depicts a cross-sectional side view representation of a portion of a transmission device, according to some embodiments.

Figure 1:
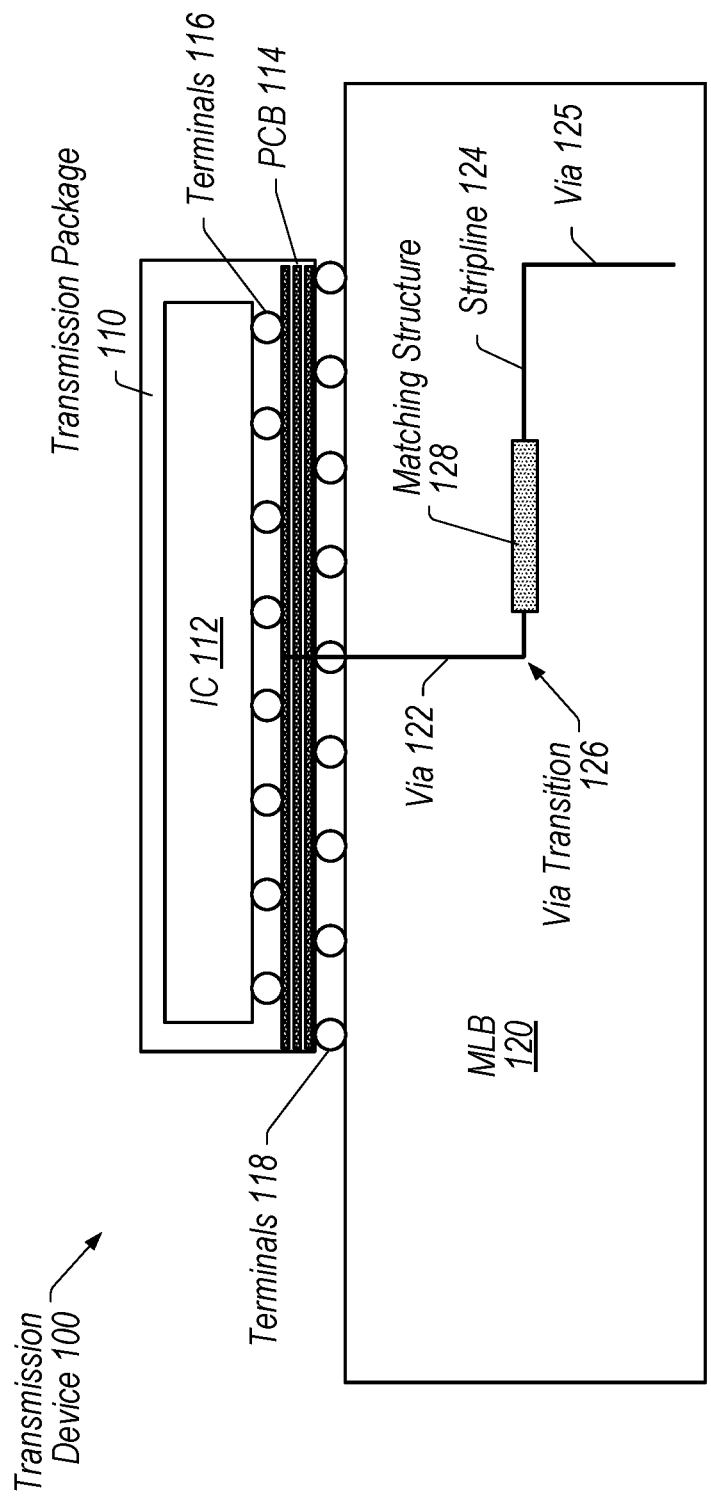
FIG. 1 depicts a cross-sectional side view representation of an example embodiment of a transmission device.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

DETAILED DESCRIPTION OF EMBODIMENTS

The present disclosure is directed to wave signal transmission in multilayer printed circuit boards (MLBs). In various embodiments, MLBs may include routing used to transmit signals at various frequencies. For instance, MLBs may provide routing for transmission of wideband millimeter wave (mmW) signals (e.g., signals with frequencies between 10 GHz and 300 GHz). In order to transmit signals in various routes through MLBs, the MLBs typically include various vias (for vertical transmission through layers in the MLBs) and various striplines (for horizontal transmission within layers in the MLBs).

Transitions between vias and striplines in MLBs may often be large contributors to decreasing return loss and increasing signal leakage during wave signal transmission. For instance, vias and striplines may have impedance mismatch at the transitions that causes decreased return loss and increased signal leakage. Accordingly, many MLB structures include impedance matching structures to reduce impedance mismatch between vias and striplines. Adding impedance matching structures may, however, increase manufacturing complexity and be susceptible to manufacturing variations.

FIG. 1 depicts a cross-sectional side view representation of an example embodiment of a transmission device. In the illustrated embodiment, transmission device 100 includes transmission package 110 coupled to MLB 120. Transmission package 110 may be, for example, a system-in-package including integrated circuit (IC) 112. In various embodiments, transmission package 110 is a millimeter wave transmission package and IC 112 is an integrated circuit for generating wave transmission signals. For example, IC 112 may be a radio-frequency integrated circuit (RFIC) capable of generating wave transmission signals in the wideband millimeter range (such as between 10 GHz and 300 GHz).

IC 112 may be coupled to printed circuit board (PCB) 114 in transmission package 110 by terminals 116. Terminals 116 may be, for example, bump terminals. PCB 114 may be a substrate for IC 112 that includes one or more layers, as shown in FIG. 1. Transmission package 110 may then be coupled to MLB 120 using terminals 118. Terminals 118 may be, for example, solder balls.

In the illustrated embodiment, MLB 120 is a multilayered printed circuit board with via 122 and stripline 124. Via 122 is, for example, a signal via for transmitting signals through MLB 120. Via 122 and stripline 124 are coupled at via transition 126. MLB 120 may also include via 125 coupled to stripline 124 at the other end of the stripline. Via 122, stripline 124, and via 125 are shown as one example of a structure in MLB 120 though it should be understood that MLB may include multiples of such structure. In various embodiments, via 122 extends through terminal 118 and through the multiple layers of PCB 114 to the terminal plane of terminals 116 (e.g., the plane where terminals 116 contact PCB 114).

Figure 2:
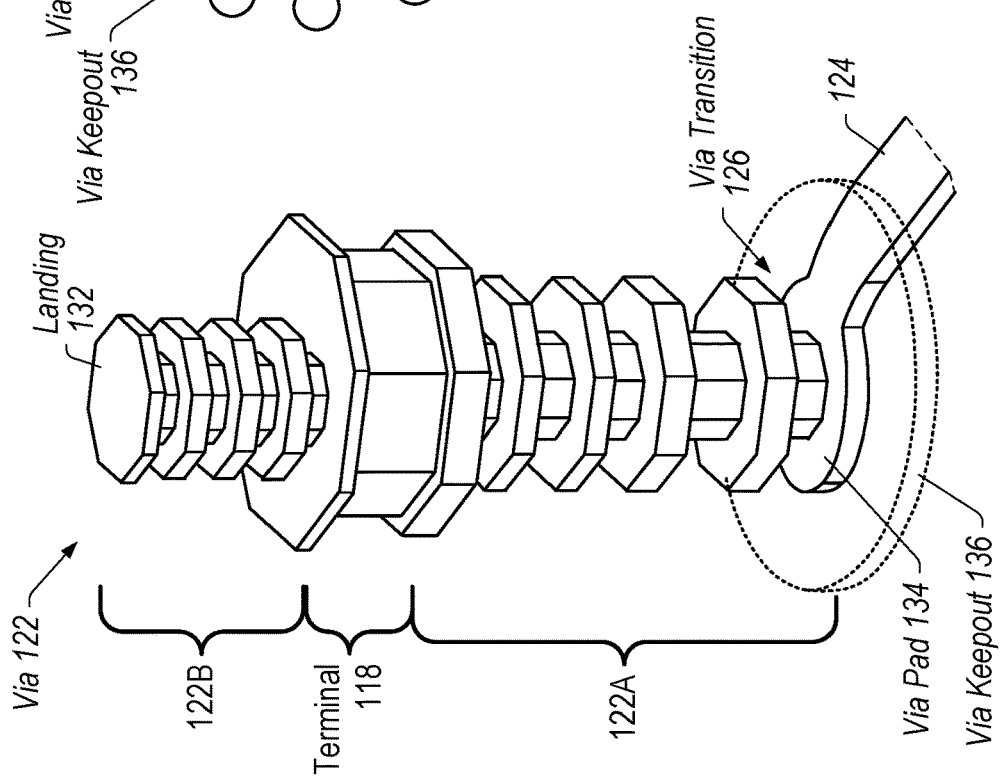
FIG. 2 depicts a perspective representation of an example embodiment of a via structure.

FIG. 2 depicts a perspective representation of an example embodiment of a structure of via 122. In the illustrated embodiment, via 122 includes lower section 122A and upper section 122B. Lower section 122A is coupled to upper section 122B by terminal 118 (e.g., a solder ball terminal). Upper section 122B terminates in landing 132 (e.g., a bump landing), which is positioned at the terminal plane of terminals 116. Lower section 122A is coupled to stripline 124 at via transition 126. The dimensions of via 122 (e.g., the outer diameters of lower section 122A and upper section 122B) are typically predetermined. For example, an area for via 122 in MLB 120 may be predetermined based on preset values from a library (such as a vendor library) or previous designs of the MLB.

Figure 3:
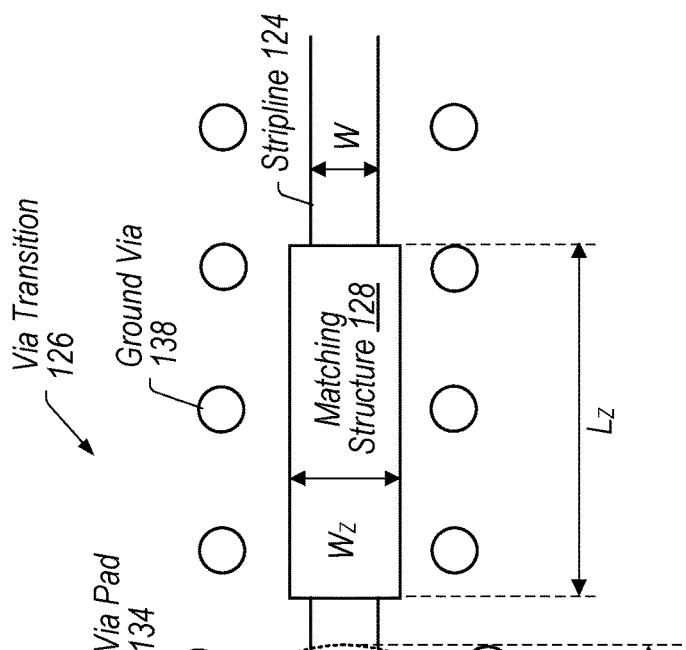
FIG. 3 depicts a top-view representation of an example embodiment of a structure of a via transition with a matching structure.

FIG. 3 depicts a top-view representation of an example embodiment of a structure of via transition 126 with matching structure 128. As shown in FIGS. 1 and 3, matching structure 128 is positioned along stripline 104 at or near via transition 126. In many instances, via 122 does not match the impedance of IC 112, which has a different impedance than stripline 124. Accordingly, matching structure 128 may be included in MLB 120 to provide impedance matching between via 122 (and IC 112) and stripline 124 at via transition 126. Impedance matching may be determined, for example, by dimensions "Lz" (length) and "Wz" (width) of matching structure 128. Lz and Wz may, for instance, be matched to the impedance of stripline 124 determined by its width ("W"). Matching structure 128 may, however, increase the complexity of manufacturing MLB 120 and reduce space available in the MLB for other routing due to the length (Lz) and width (Wz) of the matching structure. Additionally, the bandwidth for signals to be transmitted is limited with the use of via 122 and matching structure 128.

In the illustrated embodiment, via transition 126 includes via 122 surrounded by via pad 134. Via pad 134 is then surrounded by via keepout 136. Via keepout 136 defines an area around via pad 134 for electrical isolation of via pad 134 (e.g., and area where no connections or routing is allowed to prevent potential electrical shorting). Ground vias 138 may then be positioned around via keepout 136 and along stripline 124 and matching structure 128.

As shown in FIG. 3, via pad 134 has a diameter "D1" and via keepout 136 has a diameter "D2". In many instances of MLBs (or similar structures), these diameters are predetermined. For example, the diameters of via pad 134 and via keepout 136 may be predetermined based on preset values from a library or previous designs of MLB 120. These predetermined diameters limit transmission bandwidth for signals through MLB 120 and/or limit any flexibility in transmission frequency.

The present disclosure contemplates providing impedance matching through the design and dimensioning of vias while providing tunable parameters for signal transmission through dimensioning of the via pads and via keepouts. Providing impedance matching through the via may eliminate the need for impedance matching structures. Providing tunable parameters for signal transmission may allow vias and via transitions to be tunable within a wideband range of frequencies ranges and be tunable to targeted frequency bands. The disclosed via and via transition structures may also have better electrical properties such as better return loss than conventional structures such as those shown in FIGS. 1-3.

One embodiment disclosed herein has three broad elements: 1) a via passing through multiple layers of a printed circuit board that provides impedance matching between an integrated circuit (or other device) coupled to one end of the via and a stripline in the printed circuit board coupled to the other end of the via, 2) a via pad that is dimensioned to provide a selected frequency notch for signal transmission through the via and printed circuit board, and 3) a via keepout that is dimensioned to provide a selected frequency bandwidth for the signal transmission through the via and printed circuit board. In some embodiments, the via pad is dimensioned based on the dimensions of the via keepout. For example, the via keepout may have a maximum dimension allowed in the printed circuit board due to spacing and other design requirements. The via pad may then be dimensioned based on the maximum dimension of the via keepout. In some embodiments, the via pad and the via keepout are dimensioned in combination. For instance, the via pad and the via keepout may be dimensioned together to provide a selected frequency notch within a selected frequency bandwidth where the frequency notch is positioned within the selected frequency bandwidth.

In short, the present inventors have recognized that via and via transition structures may be designed to have increased flexibility for a wider range of applications. The disclosed via and via transition structures provide tunable selection for signal transmission over a wideband of millimeter wave frequencies. Additionally, the disclosed via and via transition structures have a more robust design that is less sensitive to common printed circuit board fabrication process variations. The via and via transition structure designs may also be implemented in various types of printed circuit boards for different applications.

FIG. 4 depicts a cross-sectional side view representation of a portion of a transmission device, according to some embodiments. In the illustrated embodiment, transmission device 400 includes transmission package 410 coupled to PCB 412. PCB 412 may include multiple layers (e.g., PCB 412 is an MLB). In certain embodiments, transmission package 410 includes integrated circuit 414 coupled to PCB 416 along terminal region 418. IC 414 may be, for example, a radio-frequency IC (RFIC) or other wave transmission integrated circuit. In one embodiment, IC 414 is an RFIC capable of generating wave transmission signals in the wideband millimeter range (e.g., between 10 GHz and 300 GHz). PCB 416 may be an MLB or other system-in-package printed circuit board implemented as a substrate for IC 414.

In certain embodiments, via 420 provides a path for transmission of signals (e.g., millimeter wave signals) between IC 414 and PCB 412. For example, via 420 may include a path for signal transmission between landing 422 (positioned along landing plane 424) and via pad 426 (positioned in a layer in PCB 412). In certain embodiments, via 420 is designed to provide signal transmission at frequencies in the range of IC 414 (e.g., between 10 GHz and 300 GHz). Terminal 421 may be a solder bump or solder ball providing a connection between IC 414 and landing 422 in via 420. It should be understood that while FIG. 4 depicts a single instance of via 420 in transmission device 400, transmission device 400 may include multiple instances of via 420 connecting between IC 414 and PCB 412.

Figure 5:
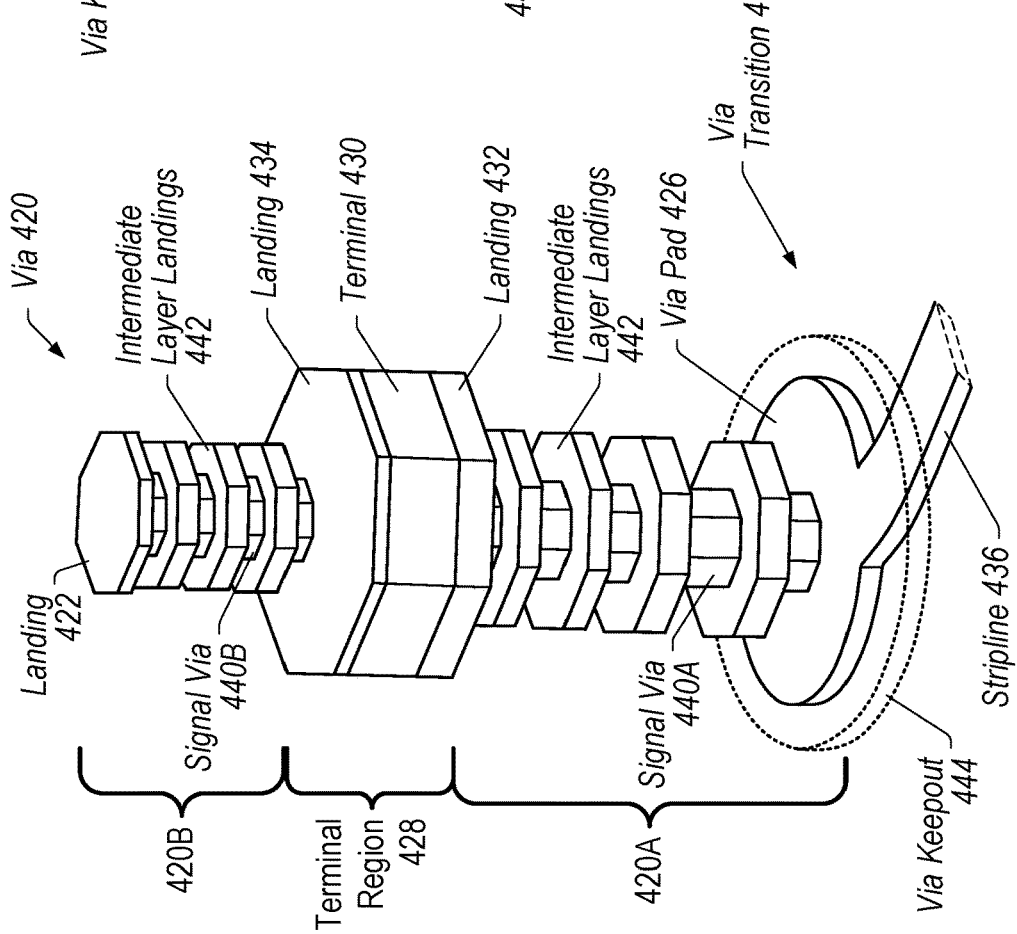
FIG. 5 depicts a perspective representation of a via structure, according to some embodiments.

FIG. 5 depicts a perspective representation of a structure of via 420, according to some embodiments. In the illustrated embodiment, via 420 includes lower section 420A and upper section 420B. Lower section 420A is a portion of via 420 in PCB 412 while upper section 420B is a portion of via 420 in PCB 416 (as shown in FIG. 4). Lower section 420A is coupled to upper section 420B in terminal region 428 by terminal 430, thus connecting PCB 412 to PCB 416. Terminal 430 may be, for example, a solder ball or solder bump terminal. Terminal 430 may be coupled to lower section 420A at landing 432 and to upper section 420B at landing 434.

As described above, upper section 420B terminates in landing 422 (e.g., a bump landing), which is positioned at landing plane 424. Lower section 420A terminates at via pad 426. Via pad 426 is coupled to stripline 436 at via transition 438. In various embodiments, via pad 426 and stripline 436 are in positioned in the same layer of PCB 412. Thus, via transition 438 provides a transition between vertical via 420 and horizontal stripline 436 through via pad 426.

In certain embodiments, via 420 is dimensioned to provide an impedance at via pad 426 that approximately matches an impedance of stripline 436. As used herein, the term "approximately matches an impedance" refers to the impedances being the same or almost the same (e.g., substantially the same). For example, in some embodiments, the impedances may approximately match when the impedances are within about 1%, within about 5%, or within about 10% of each other.

In various embodiments, dimension of via 420 is determined by dimensions of signal via 440 and intermediate layer landings 442, shown in FIG. 5. Signal via 440 may be a constant outer diameter via passing through the layers in PCB 412 and/or PCB 416 to carry the signal through the layers. In some embodiments, signal via 440 includes signal via 440A in lower section 420A and signal via 440B in upper section 420B. Signal via 440A and signal via 440B may be connected, for example, by terminal 430 and landings 432, 434. In some embodiments, signal via 440A and signal via 440B have the same outer diameter. Other embodiments may be contemplated with signal via 440A and signal via 440B having different outer diameters. For instance, signal via 440A and signal via 440B may be offset horizontally at terminal 430 and have different diameters.

In the illustrated embodiment, intermediate layer landings 442 are portions of via 420 that land at the layers in PCB 412 and/or PCB 416. Similar to signal via 440, intermediate layer landings 442 may include intermediate layer landings 442A in lower section 420A and intermediate layer landings 442B in upper section 420B. Intermediate layer landings 442A and intermediate layer landings 442B may have the same or different outer diameters. Embodiments may also be contemplated where individual intermediate layer landings 442A, 442B have outer diameters that vary from layer to layer.

In certain embodiments, dimensions (e.g., outer diameters) of signal via 440 and intermediate layer landings 442 are selected (e.g., dimensioned) to approximately match the impedance at via pad 426 with the impedance of stripline 436. For example, the combination of the outer diameter of signal via 440 and the outer diameters of intermediate layer landings 442 may be dimensioned to define an impedance at via pad 426 that approximately matches the impedance of stripline 436. Accordingly, via 420 changes the impedance from IC 414 at landing 422 to an impedance at via pad 426 that approximately matches the impedance of stripline 436. As an example, stripline 436 may be a 50Ω stripline while the impedance at landing 422 is about 25Ω and certain imaginary impedance. Thus, via 420 is dimensioned (through dimensioning the outer diameters of signal via 440 and intermediate layer landings 442) to change the impedance to approximately 50Ω at via pad 426.

In various embodiments, matching of the impedances is determined by only the portions of signal via 440 and intermediate layer landings 442 in PCB 412 (e.g., signal via 440A and intermediate layer landings 442A). In some embodiments, the outer diameters of landing 422, landing 432, and/or landing 434 may be implemented in defining the impedance at via pad 426. Matching the impedance of stripline 436 at via pad 426 in PCB 416 allows impedance matching without the need of an impedance matching structure (e.g., matching structure 128, shown in FIG. 1).

Figure 6:
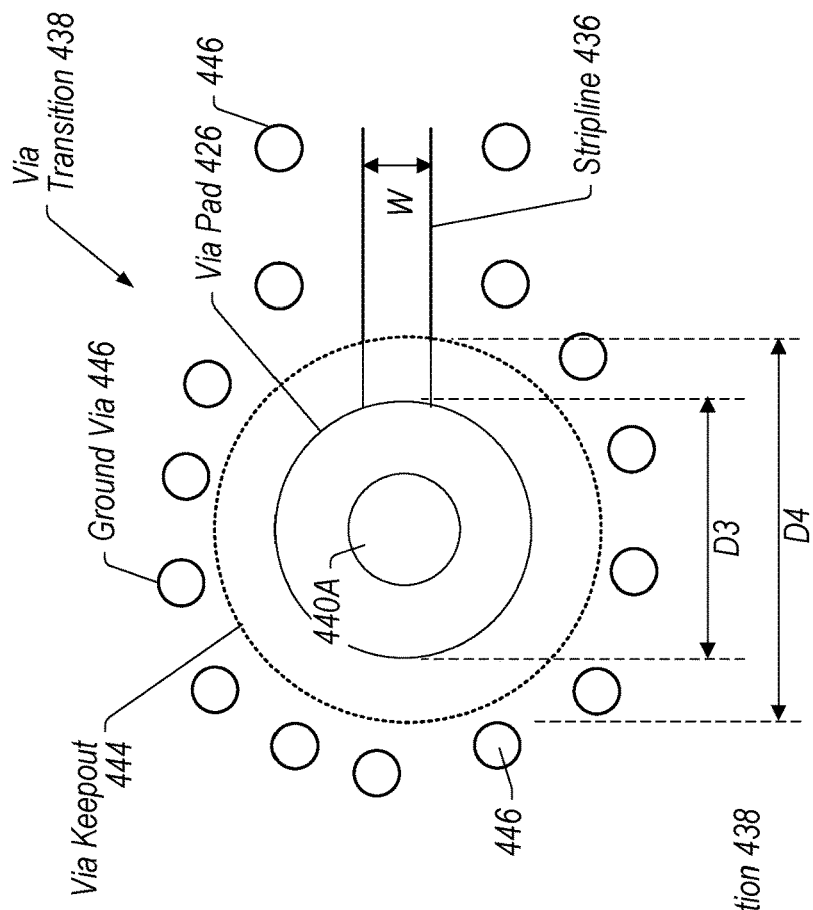
FIG. 6 depicts a top-view representation of a structure of a via transition, according to some embodiments.

Not having an impedance matching structure in PCB 416 provides more space for routing and other structures in the PCB. For instance, without an impedance matching structure in PCB 416, via keepouts and via pads may have larger dimensions (e.g., larger outer diameters) at via transition 438. FIG. 6 depicts a top-view representation of a structure of via transition 438, according to some embodiments. In the illustrated embodiment, via transition 438 includes via pad 426 (which includes bottom landing of signal via 440A), via keepout 444, and ground vias 446. "D3" is the outer diameter of via pad 426 in via transition 438 while "D4" is the outer diameter of via keepout 444.

In various embodiments, via keepout 444 is larger than via keepout 136 (shown in FIG. 3) (e.g., D4 is larger than D2) because of the absence of any impedance matching structure in via transition 438. The maximum outer diameter for via keepout 444 may be determined by spacing requirements in PCB 412. The maximum outer diameter, however, is larger in the embodiment of FIG. 6 again due to the absence of any impedance matching structure. With the larger outer diameter of via keepout 444, via pad 426 may also have larger dimensions/outer diameters (e.g., D3 may be larger than D1 for via pad 134, shown in FIG. 3).

Figure 7:
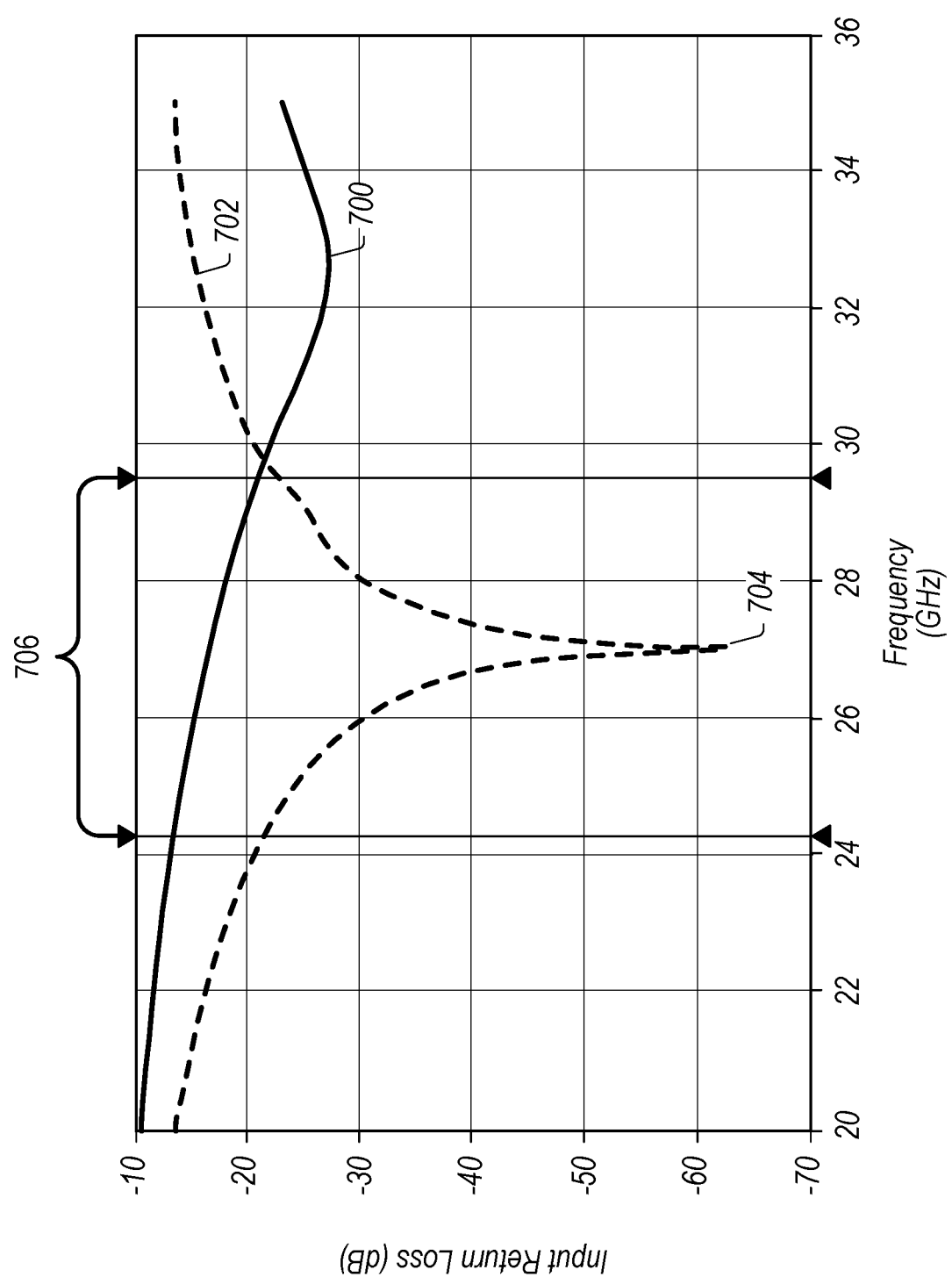
FIG. 7 depicts an example curve showing return loss versus frequency for two via/via transition structures.

In certain embodiments, the outer diameter of via keepout 444 and the outer diameter of via pad 426 are dimensioned together to provide tuning of frequency parameters for signal transmission through via 420 and stripline 436. Various embodiments of frequency parameters that may be tuned include, but are not limited to, frequency notch and frequency bandwidth. As used herein, the term "frequency notch" refers to a frequency having the highest return loss in a frequency range for the signal transmission. The term "frequency bandwidth" refers to the range of frequencies available for signal transmission. Examples of frequency notch and frequency bandwidth are shown in FIG. 7, described below.

In certain embodiments, the outer diameter of via keepout 444 is dimensioned (e.g., selected) to select the frequency bandwidth while the outer diameter of via pad 426 is dimensioned to select the frequency notch for signal transmission through via 420 and stripline 436. As described above, the allowable outer diameter of via keepout 444 (e.g., maximum outer diameter) may be larger than previous designs of via transitions. The larger allowable outer diameter for via keepout 444 may allow a larger range of variation in the outer diameter, which accordingly provides a larger range of bandwidths available through dimensioning of the via keepout. For example, a large range of millimeter wave transmission bandwidths may be available because of the larger allowable outer diameter of via keepout 444. Additionally, the larger allowable outer diameter for via keepout 444 allows a larger range of outer diameters for via pad 426, which provides a larger range of selection for the frequency notch.

Being able to tune both the frequency bandwidth and the frequency notch in combination allows for increased design flexibility in PCB 412. For example, striplines 436 in PCB 412 may have various features such as bends, snakes, or other irregular features. These various features may create narrow and different bandwidth requirements for transmission signals. Accordingly, being able to adjust the frequency parameters at via transition 438 provides tuning capability for the different bandwidths associated with striplines 436 in PCB 412 without the need for additional structures or the use of additional space in the PCB.

The disclosed embodiments of via 420 and via transition 438 further provide improved electrical characteristics compared to previous designs without the need for additional structures (such as impedance matching structures). FIG. 7 depicts an example curve showing return loss versus frequency for two via/via transition structures. Curve 700 is the return loss (in dB) versus frequency (in GHz) for a via/via transition structure similar to the structure shown in FIGS. 2-3 with the use of matching structure 128. Curve 702 is the return loss versus frequency for a via/via transition structure similar to the structure shown in FIGS. 5-6.

As shown by curve 700 in FIG. 7, the via/via transition structure similar to the structure shown in FIGS. 2-3 has low return loss with a relatively undefined frequency notch. Accordingly, an impedance matching structure may likely be needed for use in a printed circuit board. Contrastingly, curve 702 has a defined frequency notch (704) and high (and better) return loss properties for the via/via transition structure shown in FIGS. 4-6.

Additionally, as described above, the via/via transition structure shown in FIGS. 4-6 provides for tunability of curve 702, shown in FIG. 7. For instance, changing the outer diameter of via pad 426 may move frequency notch 704 left/right along the frequency axis for tuning the frequency notch. Changing the outer diameter of via keepout 444 may adjust frequency bandwidth 706 to be wider/narrower around frequency notch 704. The disclosed embodiments of via 420 and via transition 438 shown in FIGS. 4-6 are also robust structures that are less sensitive to processing variations during manufacturing. Accordingly, PCB 412 may be produced with higher yield and more reliability.

Figure 8:
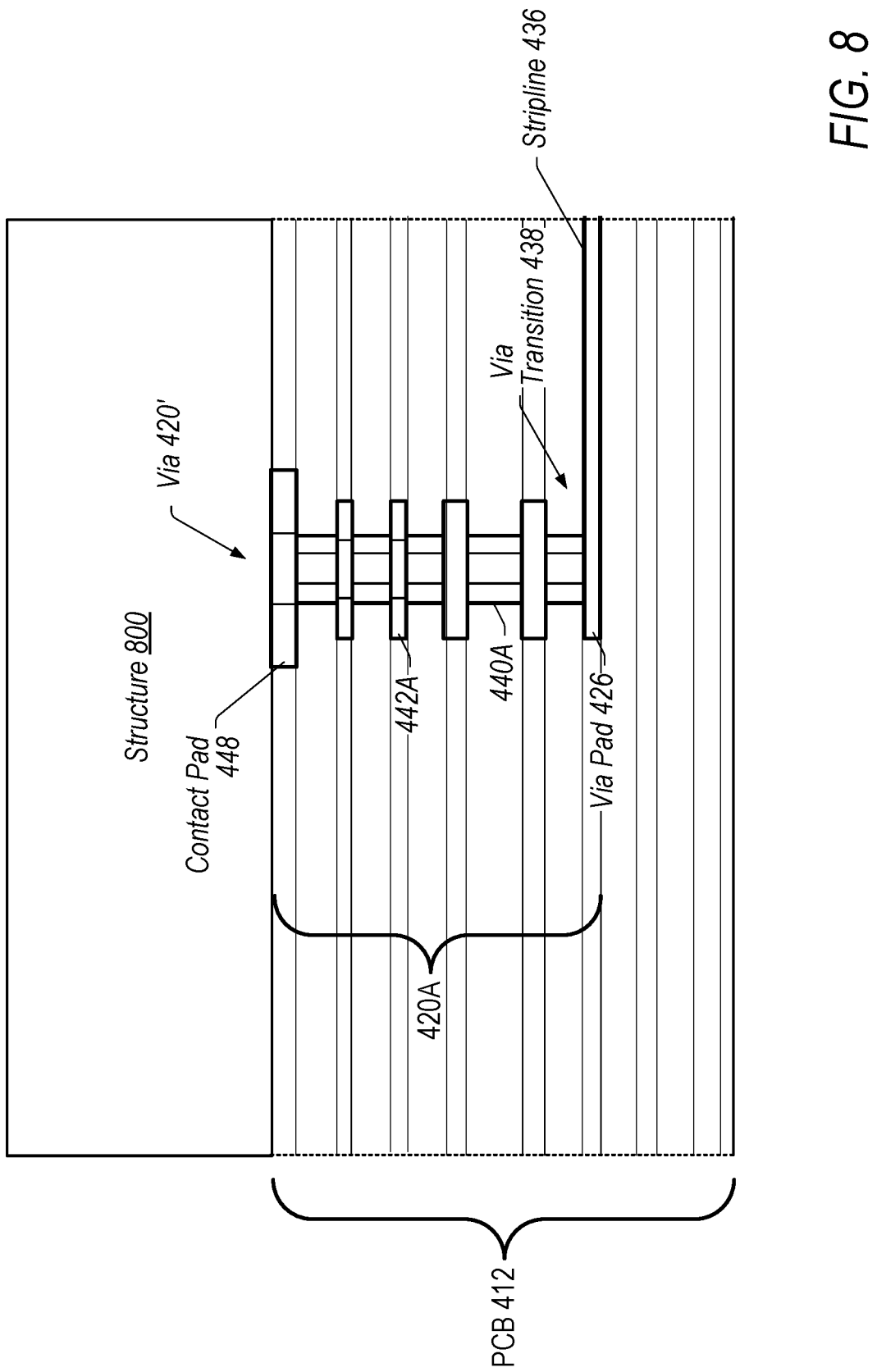
FIG. 8 depicts a cross-sectional side view representation of another embodiment of a printed circuit board.

While the embodiments depicted in FIGS. 4-6 apply the disclosed structures of via 420 and via transition 438 to MLBs (e.g., PCB 412) coupled to another MLB (e.g., PCB 416 in transmission package 410), it should be understood that these disclosed structures may be implemented in other embodiments where impedance matching between a via and a stripline and/or tuning of frequency parameters (e.g., frequency notch and frequency bandwidth) are necessitated or desired. FIG. 8 depicts a cross-sectional side view representation of an embodiment of PCB 412. In the illustrated embodiment, via 420' terminates at the upper surface of PCB 412 with contact pad 448. Contact pad 448 may be, for example, a landing pad or other terminal pad.

Figure 9:
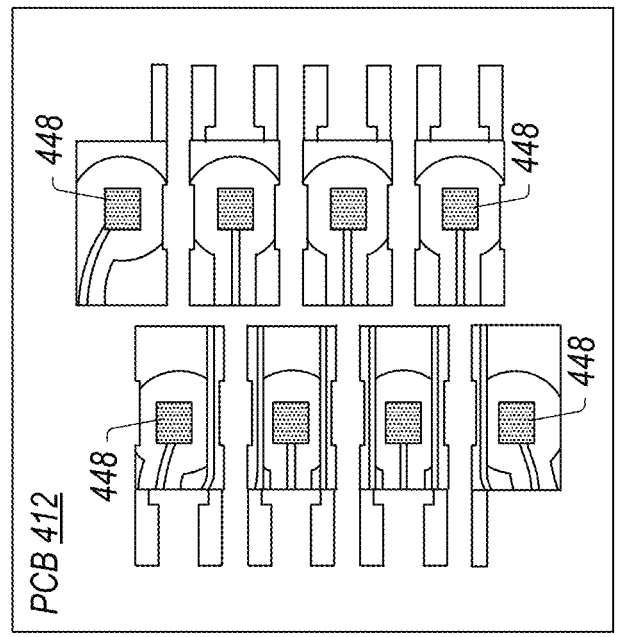
FIG. 9 depicts a perspective view representation of another embodiment of a via structure.

FIG. 9 depicts a perspective view representation of the embodiment of a structure of via 420'. In the illustrated embodiment, via 420' includes only lower section 420A between via pad 426 and contact pad 448. Accordingly, impedance matching to stripline 436 occurs in lower section 420A with dimensioning of signal via 440A and intermediate layer landings 442A. Tuning of frequency parameters is provided by via transition 438, as described herein.

Turning back to FIG. 8, in various embodiments, PCB 412 and contact pad 448 are coupled to structure 800. One contemplated embodiment of structure 800 includes a connector structure (such as a surface mount device (SMD) connector or board-to-board (B2B) or plug+receptacle connector). A B2B connector may be further coupled to a flex package or another package.

Figure 10:
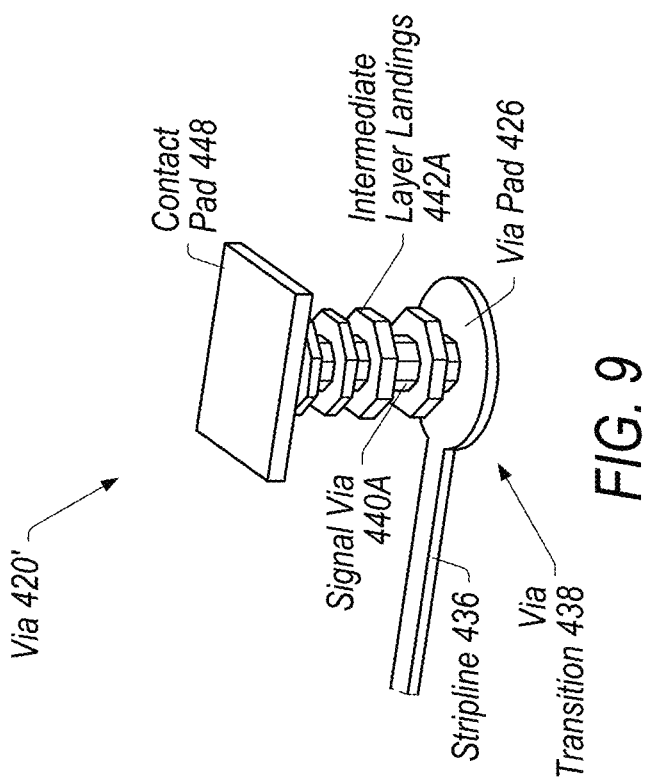
FIG. 10 depicts a top-view representation of an embodiment of a printed circuit board having multiple contact pads associated with multiple via structures.

As described herein, embodiments of PCB 412 are contemplated where the PCB includes multiple via and via transition structures. FIG. 10 depicts a top-view representation of an embodiment of PCB 412 having multiple contact pads 448 associated with multiple via structures. Contact pads 448 in the depicted embodiment of PCB 412 may be, for example, multiple contacts to multiple vias to be coupled to structure 800 (shown in FIG. 8).

Additional embodiments for implementation of via transition 438 with via pad 426 and via keepout 444 without connection to stripline 436 may also be contemplated. For example, via transition 438, via pad 426, and via keepout 444 may be implemented in a connector for coupling to millimeter wideband components or structures. In such embodiments, impedance matching in the via may not be implemented as there may not be a stripline necessitating impedance matching. Accordingly, via transition 438, via pad 426, and via keepout 444 are implemented to provide tuning of frequency parameters in the connector.

Example Computer System

Figure 11:
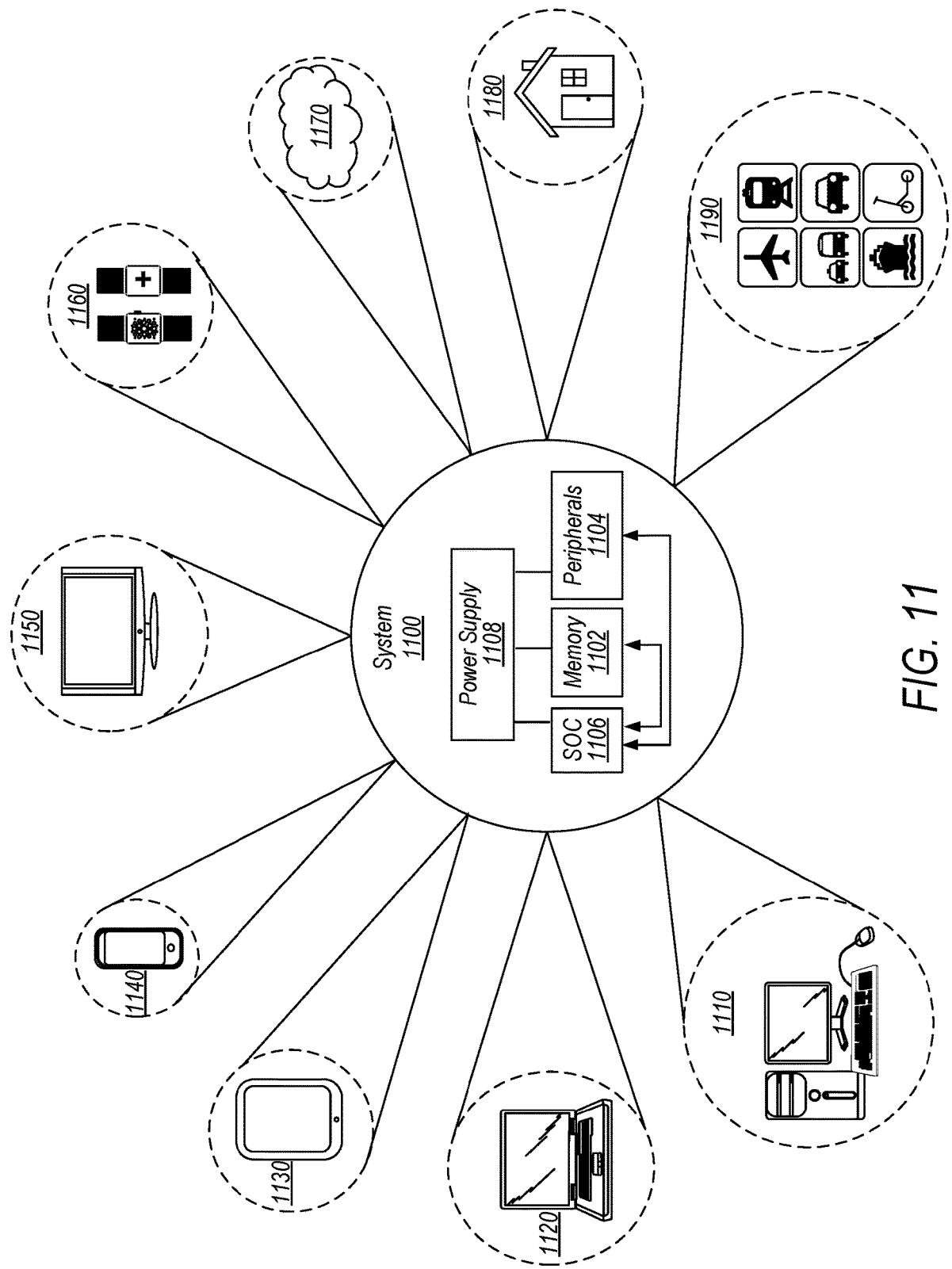
FIG. 11 is a block diagram of one embodiment of an example system.

Turning next to FIG. 11, a block diagram of one embodiment of a system 1100 is shown that may incorporate and/or otherwise utilize the methods and mechanisms described herein. In the illustrated embodiment, the system 1100 includes at least one instance of a system on chip (SoC) 1106 which may include multiple types of processing units, such as a central processing unit (CPU), a graphics processing unit (GPU), or otherwise, a communication fabric, and interfaces to memories and input/output devices. In some embodiments, one or more processors in SoC 1106 includes multiple execution lanes and an instruction issue queue. In various embodiments, SoC 1106 is coupled to external memory 1102, peripherals 1104, and power supply 1108.

A power supply 1108 is also provided which supplies the supply voltages to SoC 1106 as well as one or more supply voltages to the memory 1102 and/or the peripherals 1104. In various embodiments, power supply 1108 represents a battery (e.g., a rechargeable battery in a smart phone, laptop or tablet computer, or another device). In some embodiments, more than one instance of SoC 1106 is included (and more than one external memory 1102 is included as well).

The memory 1102 is any type of memory, such as dynamic random-access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 1104 include any desired circuitry, depending on the type of system 1100. For example, in one embodiment, peripherals 1104 includes devices for various types of wireless communication, such as Wi-Fi, Bluetooth, cellular, global positioning system, etc. In some embodiments, the peripherals 1104 also include additional storage, including RAM storage, solid state storage, or disk storage. The peripherals 1104 include user interface devices such as a display screen, including touch display screens or multi-touch display screens, keyboard or other input devices, microphones, speakers, etc.

As illustrated, system 1100 is shown to have application in a wide range of areas. For example, system 1100 may be utilized as part of the chips, circuitry, components, etc., of a desktop computer 1110, laptop computer 1120, tablet computer 1130, cellular or mobile phone 1140, or television 1150 (or set-top box coupled to a television). Also illustrated is a smartwatch and health monitoring device 1160. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 1100 may further be used as part of a cloud-based service(s) 1170. For example, the previously mentioned devices, and/or other devices, may access computing resources in the cloud (i.e., remotely located hardware and/or software resources). Still further, system 1100 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 11 is the application of system 1100 to various modes of transportation. For example, system 1100 may be used in the control and/or entertainment systems of aircraft, trains, buses, cars for hire, private automobiles, waterborne vessels from private boats to cruise liners, scooters (for rent or owned), and so on. In various cases, system 1100 may be used to provide automated guidance (e.g., self-driving vehicles), general systems control, and otherwise. These any many other embodiments are possible and are contemplated. It is noted that the devices and applications illustrated in FIG. 11 are illustrative only and are not intended to be limiting. Other devices are possible and are contemplated.

In various embodiments, one or more of the printed circuit board and via layouts described herein is implemented in a memory system (e.g., a memory chip). For example, PCB 412 or via 420, shown in FIGS. 4-6 and 8-10, may be implemented in memory system 1102, shown in FIG. 11.

In various embodiments, one or more of the printed circuit board and via layouts described herein may be designed and/or implemented using one or more processors (e.g., system 1100) executing instructions stored on a non-transitory computer-readable medium. For example, PCB 412 or via 420, shown in FIGS. 4-6 and 8-10, may be designed and/or implemented using one or more steps performed by one or more processors executing instructions stored as program instructions in a computer readable storage medium (e.g., a non-transitory computer readable storage medium).

Various portions of PCB 412 or via 420 may be designed and/or implemented by various electronic design automation (EDA) tools or computer aided design (CAD) tools. Examples of such EDA or CAD tools include Synopsys' Design Compiler® or Cadence's Encounter® RTL Compiler, Synopsis' IC Compiler, and others. These EDA or CAD tools may include one or more modules of computer program instructions that, when executed by a computer processor, cause the processor to generate a layout and, more specifically, generate one or more files for use in fabrication of a printed circuit board.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An integrated circuit package, comprising:
   at least one printed circuit board having multiple layers;
   a via passing through at least two layers of the at least one printed circuit board;
   one or more ground vias positioned around the via;
   a via contact coupled to an upper end of the via, wherein the via contact is positioned on a top layer of the at least one printed circuit board;

a via pad coupled to a lower end of the via, the via pad having a first outer diameter;

a via keepout surrounding the via pad, the via keepout having a second outer diameter that defines a ring-shaped area of electrical isolation area between the via pad and lower ends of the ground vias; and a stripline coupled to the via pad;

wherein an impedance of the via at the via pad approximately matches an impedance of the stripline, the impedance of the via at the via pad being determined by dimensions of the via between the upper end of the via and the lower end of the via; and wherein a frequency notch parameter of a signal configured to be transmitted through the via and the stripline is determined by the first outer diameter of the via pad at the lower end of the via, and wherein a frequency bandwidth parameter for the signal configured to be transmitted through the via and the stripline is determined by the second outer diameter of the via keepout at the lower end of the via.

2. The integrated circuit package of claim 1, wherein the via includes a signal via having a constant outer diameter through the at least two layers of the at least one printed circuit board and a landing at each of the at least two layers of the at least one printed circuit board, and wherein the dimensions of the via selected to provide the impedance for the via at the via pad include the outer diameter of the signal via and outer diameters of the landings.

3. The integrated circuit package of claim 1, wherein the frequency notch is a frequency with a highest return loss in a frequency range for the signal.

4. The integrated circuit package of claim 1, wherein a maximum dimension of the second outer diameter of the via keepout is determined by spacing requirements in the at least one printed circuit board.

5. The integrated circuit package of claim 1, wherein the via pad, the stripline, and the via keepout are positioned in a single layer of the at least one printed circuit board.

6. The integrated circuit package of claim 5, wherein the stripline is coupled to at least one additional via pad in the single layer of the at least one printed circuit board.

7. The integrated circuit package of claim 5, wherein the single layer with the via pad, the stripline, and the via keepout is an intermediate layer between the top layer of the at least one printed circuit board and a bottom layer of the at least one printed circuit board.

8. An integrated circuit package, comprising:

at least one printed circuit board having multiple layers;

a via passing through at least two layers of the at least one printed circuit board;

one or more ground vias positioned around the via;

a via contact coupled to an upper end of the via, wherein the via contact is positioned on a top layer of the at least one printed circuit board;

a via pad coupled to a lower end of the via, the via pad having a first outer diameter;

a via keepout surrounding the via pad, the via keepout having a second outer diameter that defines a ring-shaped area of electrical isolation area between the via pad and lower ends of the ground vias; and a stripline coupled to the via pad in the at least one printed circuit board;

wherein diametric dimensions of the via between the upper end of the via and the lower end of the via are selected to change a first impedance for the via at the upper end of the via to a second impedance for the via at the lower end of the via and at the via pad, wherein the second impedance at the lower end of the via approximately matches an impedance of the stripline;

wherein the first outer diameter of the via pad at the lower end of the via determines a frequency notch of a signal configured to be transmitted through the via and the stripline; and wherein the second outer diameter of the via keepout at the lower end of the via determines a frequency bandwidth for the signal configured to be transmitted through the via and the stripline.

9. The integrated circuit package of claim 8, wherein the via includes a signal via through the at least two layers of the at least one printed circuit board and a landing at each of the at least two layers of the at least one printed circuit board, and wherein the diametric dimensions of the via include outer diameters of the signal via and the landings.

10. The integrated circuit package of claim 8, wherein the stripline is coupled to at least one additional via in the at least one printed circuit board.

11. The integrated circuit package of claim 8, wherein the frequency notch is selected to be within the frequency bandwidth.

12. The integrated circuit package of claim 8, further comprising a signal generating integrated circuit package, the signal generating integrated circuit package having a contact coupled to the via contact.

13. The integrated circuit package of claim 12, wherein the signal generating integrated circuit package includes at least one integrated circuit configured to generate the signal configured to be transmitted through the via and the stripline.

14. The integrated circuit package of claim 13, wherein the via changes an impedance of the at least one integrated circuit at the via pad to the impedance of the stripline.

15. An integrated circuit package, comprising:

at least one printed circuit board having multiple layers;

a plurality of vias passing through at least two layers of the at least one printed circuit board;

a plurality of ground vias positioned around the vias;

a plurality of via contacts coupled to upper ends of the vias, wherein the via contacts are positioned on a top layer of the at least one printed circuit board;

a plurality of via pads coupled to lower ends of the vias, the via pads having first outer diameters;

a plurality of via keepouts surrounding the via pads, the via keepouts having second outer diameters that define ring-shaped areas of electrical isolation area between the via pads and lower ends of the ground vias; and a plurality of striplines coupled to the via pads in the at least one printed circuit board;

wherein diametric dimensions of the vias between the upper end of the via and the lower end of the via are selected to provide impedances for the vias at the via pads that substantially match impedances of the striplines; and wherein the first outer diameters at the lower end of the vias determine a frequency notch of a signal configured to be transmitted through the vias and the striplines, and wherein the second outer diameters at the lower end of the vias determine a frequency bandwidth of the signal configured to be transmitted through the vias and the striplines.

16. The integrated circuit package of claim 15, further comprising a signal generating integrated circuit package, the signal generating integrated circuit package having a plurality of contacts coupled to the via contacts, and wherein the signal generating integrated circuit package includes at least one integrated circuit configured to generate the signal configured to be transmitted through the vias and the striplines.

17. The integrated circuit package of claim 15, further comprising a connector package, the connector package having a plurality of contacts coupled to the via contacts.

18. The integrated circuit package of claim 12, wherein the at least one printed circuit board includes at least two printed circuit boards stacked together and coupled to the signal generating integrated circuit package, the via passing through at least one layer of each of the at least two printed circuit boards with the via contact coupled to the contact of the signal generating integrated circuit package.

19. The integrated circuit package of claim 18, further comprising a terminal region at a junction between the at least two printed circuit boards, wherein the terminal region provides a transition between a portion of the via in a first of the at least two printed circuit boards and a portion of the via in a second of the at least two printed circuit boards.

20. The integrated circuit package of claim 19, further comprising a terminal positioned in the terminal region, wherein the terminal connects the portion of the via in the first of the at least two printed circuit boards and the portion of the via in the second of the at least two printed circuit boards.

* * * * *